US00RE35573E

United States Patent [19]

Clemens

[11] E Patent Number: Re. 35,573

[45] Reissued Date of Patent: Jul. 29, 1997

[54] HEAT SINK CLIP ASSEMBLY

[75] Inventor: Donald L. Clemens, The Colony, Tex.

[73] Assignee: Thermalloy, Inc., Dallas, Tex.

[21] Appl. No.: 502,852

[22] Filed: Apr. 2, 1990

Related U.S. Patent Documents

Reissue of:

[64] Patent No.: 4,745,456
Issued: May 17, 1988
Appl. No.: 905,657
Filed: Sep. 11, 1986

[51] Int. Cl.[6] ..... H01L 23/34; H05K 7/20; F28F 7/00

[52] U.S. Cl. ..... 257/719; 257/713; 257/717; 165/80.3; 174/16.3; 361/704; 361/718

[58] Field of Search ..... 357/79, 81; 165/80.2; 361/386, 704, 718; 257/713, 719, 717

[56] References Cited

U.S. PATENT DOCUMENTS

| | | | |
|---|---|---|---|
| Re. 29,080 | 12/1976 | Kiko | 333/214 |
| Re. 30,597 | 5/1981 | Grindheim | 374/173 |
| Re. 32,087 | 2/1986 | Hamprecht et al. | 71/28 |
| Re. 33,549 | 3/1991 | Weigert | 564/409 |
| Re. 33,719 | 10/1991 | Levin | 426/658 |
| 4,000,509 | 12/1976 | Jarvela | 257/697 |
| 4,660,123 | 4/1987 | Hermann | 257/718 |
| 5,019,940 | 5/1991 | Clemens | 165/80.3 |

*Primary Examiner*—Mahshid D. Saadat
*Attorney, Agent, or Firm*—Jack A. Kanz

[57] ABSTRACT

Disclosed is a heat sink clip assembly comprising a frame and a clip for securing and aligning a heat sink with an electronic device package. The frame includes a cavity for receiving the electronic device package with the leads thereof exposed for mounting on a printed circuit board or the like. A resilient heat sink clip is removably engaged with a pair of latching members on the perimeter of the frame. The clip includes means for releasably gripping the heat sink. The heat sink is urged by the heat sink clip into intimate thermal contact with the electronic device package for dissipation of heat therefrom.

18 Claims, 5 Drawing Sheets

HEAT SINK CLIP ASSEMBLY

Matter enclosed in heavy brackets [ ] appears in the original patent but forms no part of this reissue specification; matter printed in italics indicates the additions made by reissue.

FIELD OF THE INVENTION

This invention relates generally to apparatus for securing electronic components together. More particularly, it relates to apparatus for use in securing a heat sink to an electronic device package.

BACKGROUND OF THE INVENTION

For purposes of this disclosure, a heat sink is any body of metal or like material placed in contact with an electronic device package for transferring heat through conduction from the semiconductor device contained in the electronic device package and rapidly dissipating such heat to the environment. One type of electronic device package is known as a gate array. A gate array includes a relatively thin square or rectangular housing containing a semiconductor device. A plurality of rigid leads are electrically connected to the semiconductor device and extend downwardly from a lower surface of the housing. The gate array is mounted on a printed circuit board by inserting each of the leads into an aligned preformed hole in the printed circuit board and soldering the lead therein.

Finned heat sinks have been found to be particularly effective when used with gate arrays. A finned heat sink consists of a central post having a plurality of spaced fins extending radially from the post. When one end of the post is mounted on the gate array housing, heat generated by the semiconductor device contained therein is conveyed through the post and dissipated into the environment by the large surface area presented by the fins.

Various means have been used in the past to attach a heat sink in intimate thermal contact with an electronic device package. It is known to glue or otherwise adhesively attach a heat sink to an electronic device package such as a gate array. However, assembly of a sink to the electronic deice package is messy, tedious, labor intensive and therefore expensive and it is difficult to accurately align the heat sink with the electronic device package. This is particularly a problem when attaching a finned heat sink to a gate array. Many of the commonly used adhesives emit fumes or otherwise constitute an undesirable health hazard. Frequently, it is necessary to cure the glue at an elevated temperature for extended periods of time, further increasing the manufacturing costs. It is also sometimes desirable to remove the heat sink from the electronic device package for repair or replacement. This is extremely difficult, if not impossible, to accomplish when the heat sink is adhesively mounted on the electronic device package.

SUMMARY OF THE INVENTION

The present invention provides a heat sink clip assembly for securing a heat sink to an electronic device package for dissipation of heat therefrom. The heat sink clip assembly includes a frame having cavity for receiving the electronic device package and a pair of flanges for releasably securing the heat sink clip to the frame. The heat sink clip is also adapted to releasably grip the heat sink so as to align and secure the heat sink in intimate thermal contact with the electronic device package. The invention therefore provides the advantages of improved heat sink clip assembly for use in securing a finned heat sink in intimate thermal contact with a gate array which mechanically secures the heat sink to the electronic device package. The structure of the invention automatically aligns the heat sink with the electronic device package and is quickly and easily assembled and disassembled from the heat sink and electronic device package.

BRIEF DESCRIPTION OF THE DRAWINGS

So that the manner in which the above recited features and advantages of the invention as well as others which will become apparent to those skilled in the art are obtained and can be understood in detail, a more particular description of the invention briefly summarized above may be had by reference to the embodiments thereof which are illustrated in the accompanying drawing, which drawing forms a part of the specification and in which like numerals depict like parts in the several views. It is to be noted, however, that the appended drawing illustrates only preferred embodiments of the invention and is therefore not to be considered limiting of its scope, for the invention may admit to other equally effective embodiments.

DETAILED DESCRIPTION OF THE INVENTION

Figure 1:
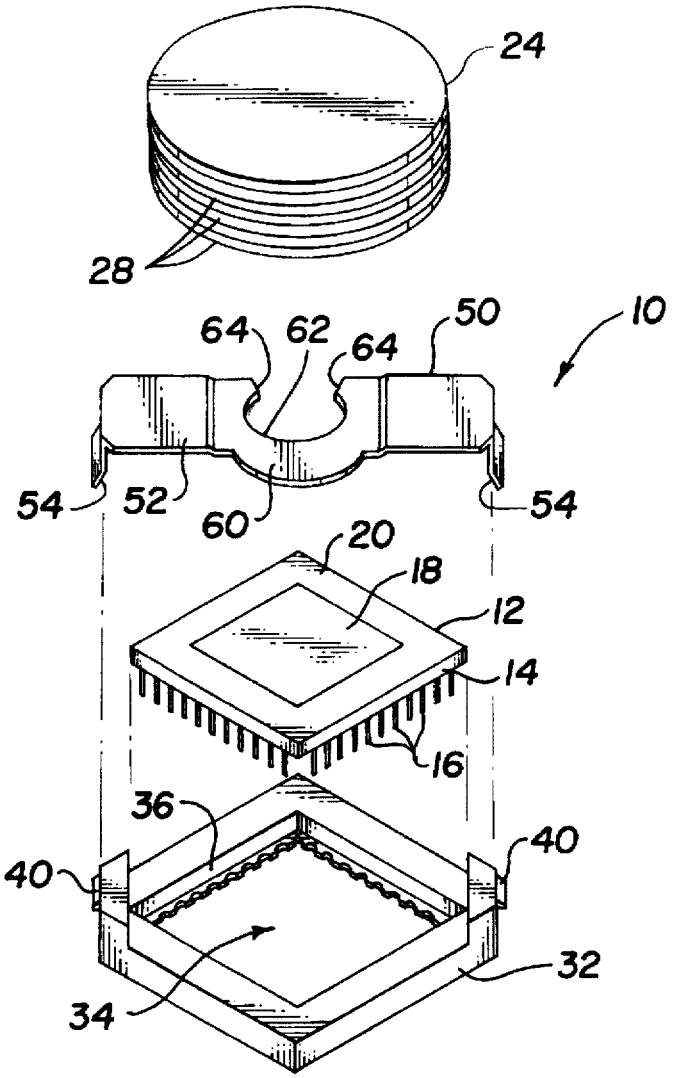
FIG. 1 is an exploded perspective view of a heat sink clip assembly according to one embodiment of the invention.
Figure 2:
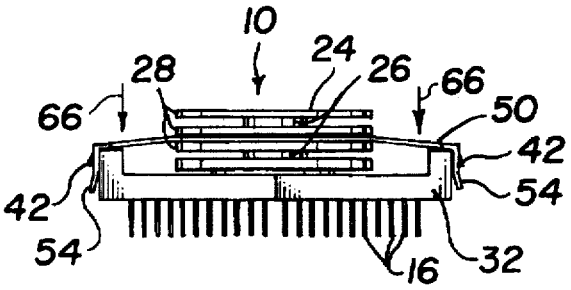
FIG. 2 is a side elevational view of the heat sink clip assembly of FIG. 1.

Referring now to FIGS. 1 and 2, the reference numeral 10 generally indicates the heat sink clip assembly of this invention. The heat sink clip assembly is used in conjunction with gate array 12 having a square or rectangular housing 14 and plurality of downwardly depending leads 16 projecting from a lower surface (not shown) of the housing. Pad 18 is formed on the upper surface 20 of housing 14 and is in thermal contact with a semiconductor device (not shown) contained within the housing for rapidly transferring heat exteriorly of the gate array package. Finned heat sink 24 is provided for use with gate array 12. The finned heat sink 24 includes a post 26 having one end in intimate thermal contact with pad 18 of the gate array. However, it is recognized that certain gate array designs do not incorporate a pad. Therefore the finned heat sink is placed in direct contact with the upper surface of the gate array housing. A plurality of longitudinally spaced fins 28 project radially from the post and present a large collective surface area for dissipating heat from the gate array through the heat sink.

Figure 3:
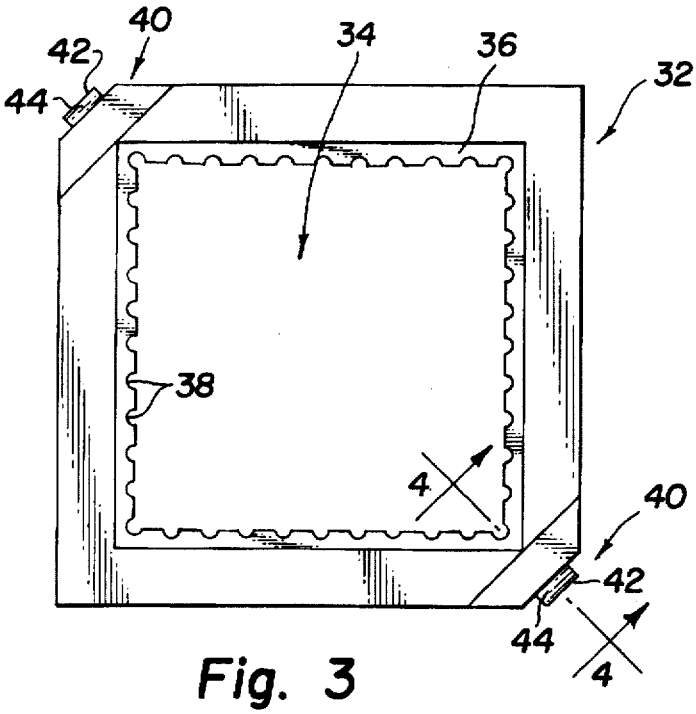
FIG. 3 is a top plan view of the frame of FIG. 1.
Figure 4:
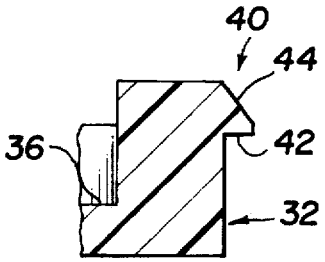
FIG. 4 is a fragmentary sectional view taken along plane 4—4 of FIG. 3.

Frame 32, shown in more detail in FIGS. 3 and 4, includes cavity 34 for receiving the gate array 12 in close confinement about the side edges of the gate array housing. The frame is preferably constructed of electrically insulating material such as nytron or delrin and is easily molded or manufactured to conform to a desired shape. The frame includes shoulder 36 extending inwardly into cavity 34 so as to contact the lower surface and side edges of the gate array housing and support the gate array in a predefined position within the cavity. Further, the inner edge of the cavity may include a plurality of semicircular notches 38. Each of the notches 38 is aligned with one of the outermost downwardly depending leads 16 of the gate array when the gate array is located in the cavity of the frame. The notches 38 assist in aligning the gate array housing with respect to the frame. A pair of spaced latching members 40 are formed on the perimeter of the frame. Specifically, the latching members 40 are located on opposite corners of the frame and each includes an outwardly projecting tooth 42 with inclined surface 44. If desired, the latching members may be formed on opposite sides of the frame rather than on opposite corners as illustrated.

Figure 5:
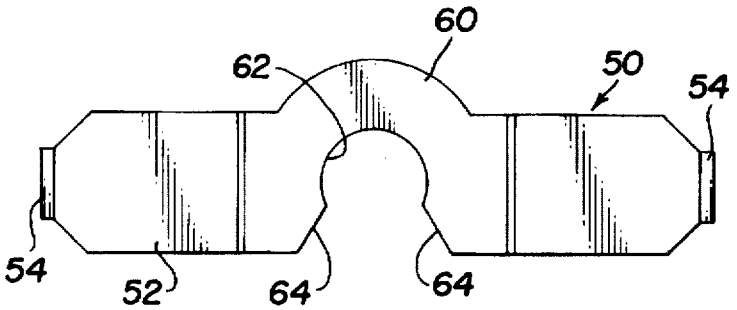
FIG. 5 is a top plan view of the heat sink clip of FIG. 1.
Figure 6:
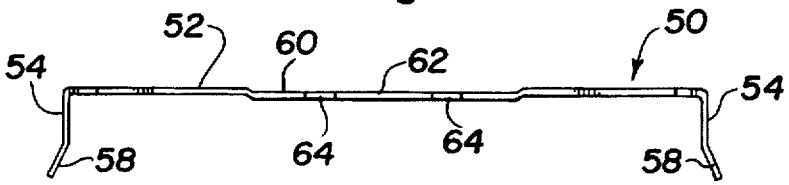
FIG. 6 is a side elevational view of the heat sink clip of FIG. 1.
Figure 7:
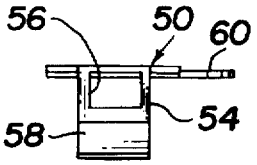
FIG. 7 is an end view of the heat sink clip of FIG. 1.

Heat sink clip 50, shown in more detail in FIGS. 5–7, is provided to secure the finned heat sink 24 to the gate array 12. The heat sink clip is constructed of resilient, preferably metallic, material and includes an elongated body 52 terminating at both ends in downwardly depending flanges 54. Each flange includes an opening 56 and an outwardly flaring lip 58. The body includes an intermediate arcuate section 60 defining aperture 62. The aperture has an internal diameter at left equal to the outer diameter of the post 26 of the finned heat sink 24. Tapered edges 64 lead into the aperture from one side of the heat sink clip.

Figure 8A:
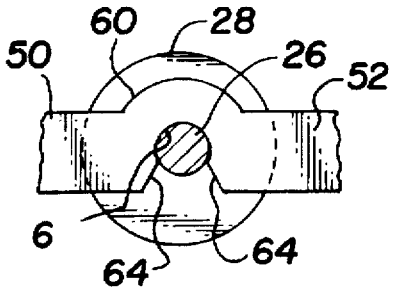
FIG. 8A is a fragmentary sectional view of the heat sink clip and finned heat sink assembly of FIG. 2 taken immediately above the heat sink clip.
Figure 8B:
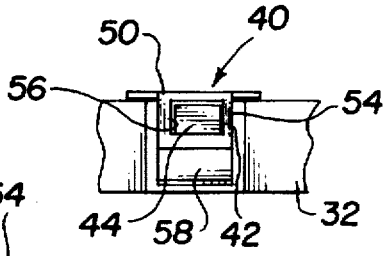
FIG. 8B is a magnified fragmentary view of the heat sink clip of FIG. 2 engaged with a latching member.

In assembled condition the gate array 12 is positioned in the cavity 34 of the frame 32 with the leads 16 of the gate array extending downwardly for presentation to aligned preformed holes (not shown) in a printed circuit board (not shown). As is shown in greater detail in FIG. 8A, the heat sink clip 50 is inserted between two fins of the finned heat sink so that post 26 is captured within aperture 62 of the arcuate section 60 of the clip. The finned heat sink is then brought downwardly in direction 66 into contact with pad 18 of the gate array housing. The flanges 54 of the heat sink clip are each aligned with one of the latching members 40 of the frame. By simultaneously deflecting the flanges of the heat sink clip downwardly as the heat sink is lowered toward the frame, the flanges 54 are each brought into engagement with one of the latching members 40. Specifically, the lips 58 of the flanges encounter the inclined surface 44 of the latching member and deflect the flanges outwardly until the openings 56 encounter the bottom of the teeth 42. The flanges then assume a relaxed position, as shown in FIG. 8B, with the teeth 42 caught in openings 56 and securing the clip to the frame with the finned heat sink in intimate thermal contact with pad 18 of the gate array.

Preferably, the heat sink clip 50 is inserted between a pair of fins at a sufficient height above the gate array so that the clip exerts a resilient force in direction 66 on the finned heat sink urging it into intimate thermal contact with the pad. In such a position and as shown in FIG. 2, the body of the heat sink clip assumes a bowed or concave posture. The heat sink clip assembly may be quickly and easily disassembled by disengaging the flanges 54 of the heat sink clip from the latching members 40 of the frame and withdrawing the finned heat sink from the gate array. Another advantage of the heat sink clip of this invention is that the heat sink clip and frame cooperate to automatically align the finned heat sink with the gate array, thus reducing assembly time and expense while maintaining the heat sink in alignment even if the assembly is subjected to mechanical vibration or other forces. Location of the latching members 40 at opposite corners of the frame is advantageous in situations where two or more gate arrays are mounted on a printed circuit board or the like in close proximity. In such a case the distance between the frames of adjacent heat sink clip assemblies may be minimized by offsetting the opposing latching members. That is, the latching members are located on opposite corners of adjacent frames so that the distances which the latching members protrude from their respective frames at least partially overlap instead of being additive. However, such an arrangement is not required for the heat sink clip assembly of this invention.

Figure 5A:
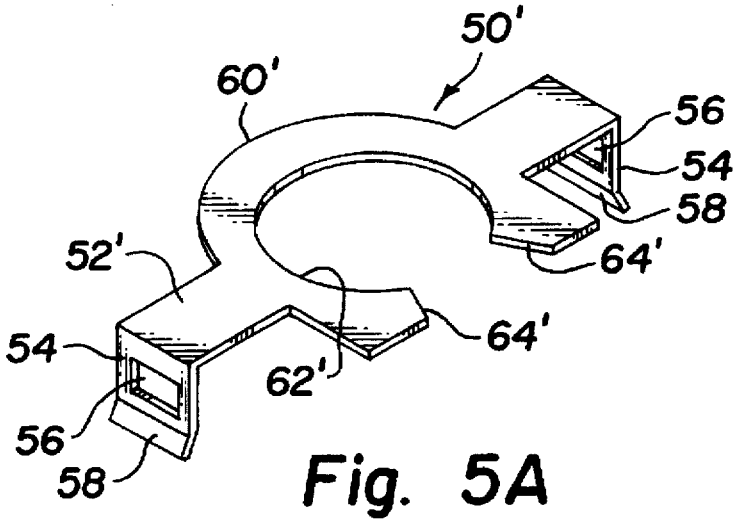
FIG. 5a is a perspective view of an alternate embodiment of the heat sink clip of FIG. 5.

An alternate embodiment 50' of the heat sink clip is shown in FIG. 5A. The heat sink clip 50' includes an elongated body 52' terminating at either end in downwardly depending flanges 54. Each of the flanges includes an opening 56 and an outwardly flaring lip 58 as in the embodiment of FIGS. 5–7. The body 52' includes an arcuate section 60' defining aperture 62'. The aperture 62' has an internal diameter at least equal to the outer diameter of the post 26 of the finned heat sink 24. Tapered edges 64' lead into the aperture from one side of the heat sink clip. However, in this embodiment the aperture 62' encompasses a greater portion (i.e. at least 270°) of the periphery of the post of the finned heat sink and thus more securely mounts the finned heat sink in contact with the gate array. In all other respects, this alternate embodiment is as described above with respect to the embodiment of FIG. 5.

An alternate embodiment of the heat sink clip assembly is shown in FIGS. 9–13. As in the embodiment of FIGS. 1–8, the heat sink clip assembly 110 is used in conjunction with gage array 112 having a rectangular housing 114 and a plurality of downwardly depending leads 116 projecting from a lower surface (not shown) of the housing. Pad 118 is formed on upper surface 120 of the housing 114 and is in thermal contact with a semiconductor device (not shown) contained within the housing for rapidly transferring heat from the gage array housing. Finned heat sink 124 is provided for use with gage array 112. The finned heat sink 124 is substantially similar to finned heat sink 24 and includes a post (not shown in FIGS. 9 and 10) having one end in thermal contact with pad 118 of the gate array. A plurality of longitudinally spaced fins 128 project radially from the post and present a large collective surface area for dissipating heat from the gate array through the heat sink.

Frame 132, shown in more detail in FIGS. 3 and 4, includes cavity 134 for receiving the gate array 112 in close confinement about the side edges of the gate array housing. The frame is preferably constructed of electrically insulating material such as nytron or delrin and is easily molded or manufactured to conform to a desired shape. Frame 132 includes shoulder 136 extending inwardly into cavity 134 so as to contact the lower surface of the gate array housing and support the gate array in a predefined position within the cavity. Further, the inner edge of the cavity may include a plurality of semicircular notches 138. Each of the notches 138 is aligned with one of the outermost downwardly depending leads 116 of the gate array when the gate array is located in the cavity of the frame. The notches 138 assist in aligning the gate array housing with respect to the frame. A pair of spaced latching members 140 is formed on the perimeter of the frame. Specifically, the latching members 140 are located on opposite sides of the perimeter of the frame and each includes an outwardly projecting tooth 142. If desired, the latching members may be formed on opposite corners of the frame rather than on opposite sides as illustrated in the embodiment of FIGS. 1–8.

Heat sink clip 150 is provided to secure the finned heat sink 124 to the gate array 112. The heat sink clip is constructed of resilient material and includes an elongated rod-like body 152 terminating at both ends in downwardly deflected arcuate ends 154 and 156.

Figure 9:
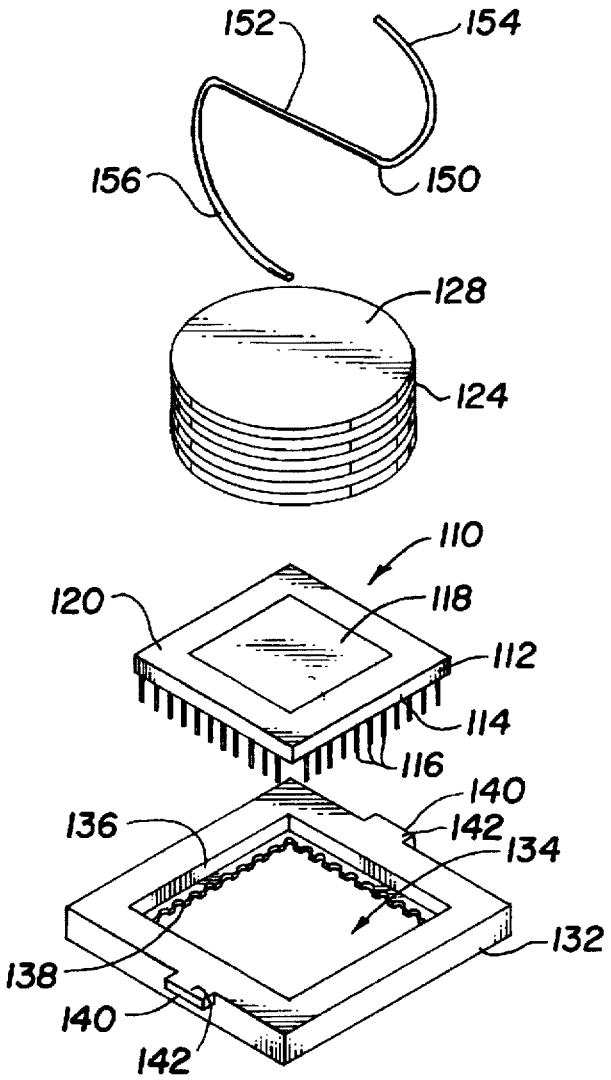
FIG. 9 is an exploded view of an alternate embodiment of the heat sink clip assembly of the invention.
Figure 10:
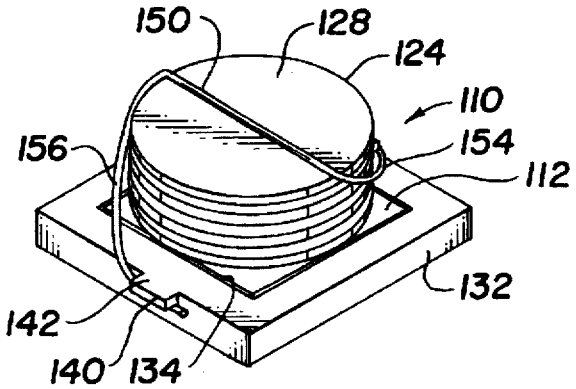
FIG. 10 is a perspective view of the heat sink clip assembly of FIG. 9.

The embodiment of heat sink clip assembly shown in FIGS. 9–13 is assembled similarly to that shown in FIGS. 1–8. Gate array 112 is positioned in cavity 134 of frame 132 with the leads 116 of the gate array extending downwardly for presentation to aligned preformed holes (not shown) in a printed circuit board (not shown). The heat sink clip 150 shown in FIGS. 9 and 10 is placed over the uppermost fin of the finned heat sink 124. The finned heat sink is then urged into contact with the pad 118 (not shown in FIG. 10) of the gate array housing. The ends 154 and 156 of the heat sink clip are each aligned with one of the latching members 140 of the frame 132. By simultaneously deflecting the ends 154 and 156 of the heat sink clip downwardly toward the frame, the ends are each brought into engagement with one of the latching members. Specifically, the ends encounter the teeth 142 of the latching member. The ends then assume a position engaging the teeth and securing the clip to the frame with the finned heat sink in contact with the gate array.

Figure 11:
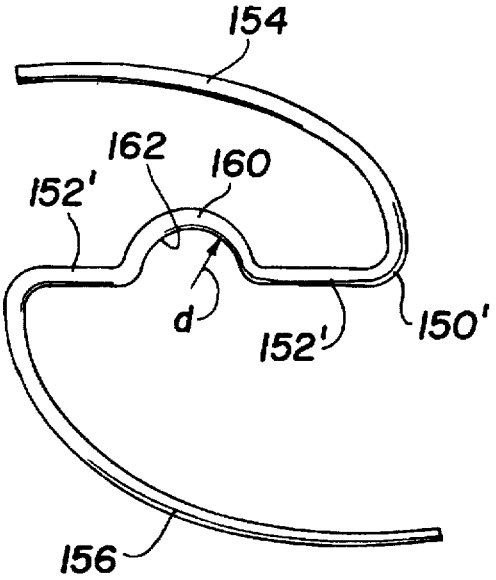
FIG. 11 is a top plan view of an alternate embodiment of the heat sink clip of FIG. 9.
Figure 12:
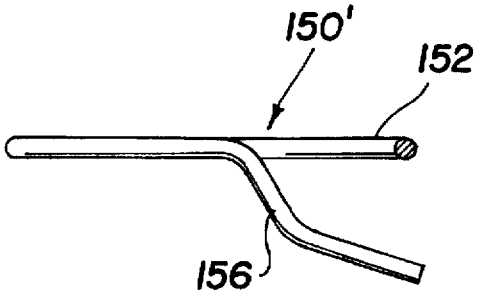
FIG. 12 is a fragmentary side view of the heat sink clip of FIG. 11.
Figure 13:
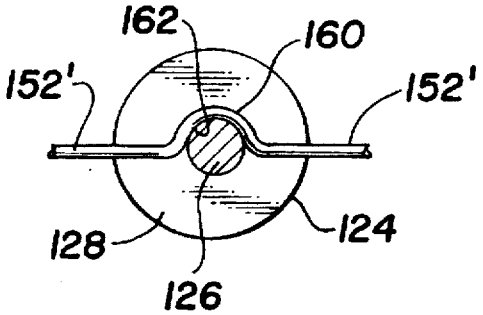
FIG. 13 is a fragmentary sectional view of a heat sink clip assembly using the clip of FIG. 11.

In an alternate embodiment 150' of the heat sink clip (shown in FIGS. 11–13), the body 152' includes an arcuate section 160). The arcuate section defines aperture 162 having an internal diameter ("d" in FIG. 11) at least equal to the outer diameter of the post 126 (shown in FIG. 13) of the finned heat sink 124. The heat sink clip 150' of FIGS. 11–13 is inserted between two fins 128 of the finned heat sink 124 so that the post 126 is captured within aperture 162 of arcuate section 160 of the clip. Preferably, the heat sink clip 150' is inserted between a pair of fins at a sufficient height above the gate array so that the clip exerts a resilient downward force on the finned heat sink urging it into intimate thermal contact with the pad.

Figure 14:
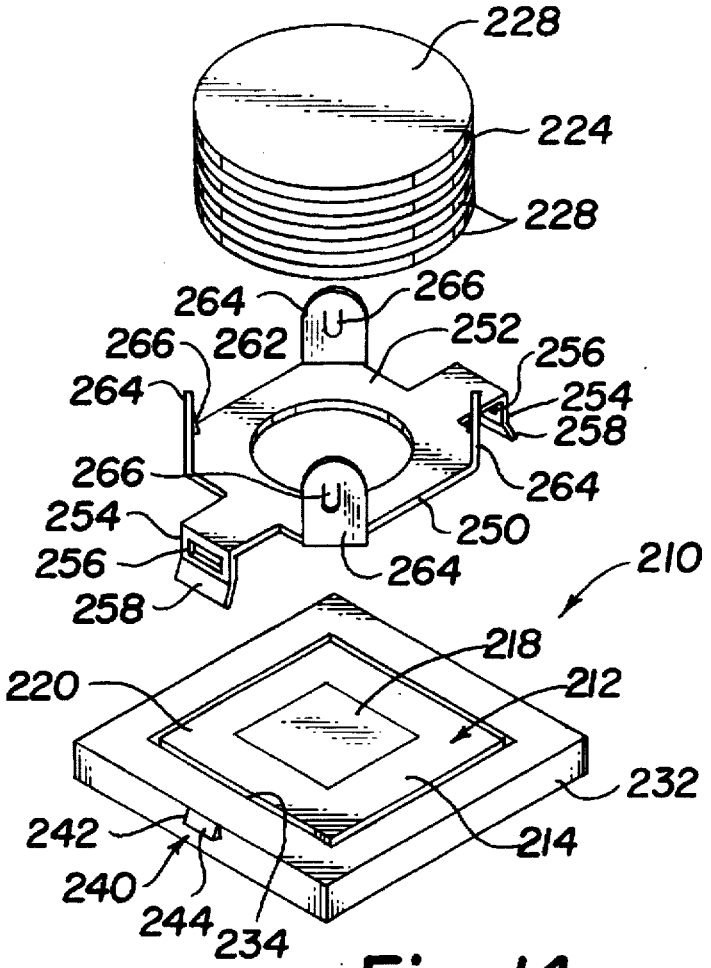
FIG. 14 is an exploded perspective view of another alternate embodiment of the heat sink clip assembly of the invention.

FIG. 14 shows another alternative embodiment 210 of the heat sink clip assembly of this invention. The heat sink clip of FIG. 14 is used in conjunction with gate array 212 having a rectangular housing 214 and a plurality of downwardly depending leads (not shown) projecting from a lower surface of the housing. Pad 218 is formed on upper surface 220 of the housing 214 and is in thermal contact with a semiconductor device (not shown) contained within the housing for rapidly transferring the heat from the gate array package. Finned heat sink 224 is provided for use with gate array 212. The finned heat sink 224 includes a post (not shown) having one end adapted for intimate thermal contact with pad 218 of the gate array. A plurality of longitudinally spaced fins 228 project radially from the post and presents a large collective surface area for dissipating heat from the gate array through the heat sink.

Frame 232 includes a cavity 234 for receiving the gate array 212 in close confinement about the side edges of the gate array housing. The frame includes a shoulder (not shown) extending inwardly into cavity 234 to contact lower surface and side edges of the gate array housing in close confinement and support the gate array in a predefined position within the cavity. Further, the inner edge of the cavity may include a plurality of semicircular notches (not shown). Each notch is aligned with one of the outermost downwardly depending leads of the gate array when the gate array is located in the cavity of the frame. The notches assist in aligning the gate array housing with respect to the frame. A pair of spaced latching members 240 (only one of which is shown in FIG. 14) is formed on the perimeter of the frame. Specifically, the latching members 240 are located on opposite sides of the frame and each includes an outwardly projecting tooth 242 having an inclined surface 244. If desired, the latching members may be formed on opposite corners of the frame rather than on opposite sides as illustrated in the embodiment of FIGS. 1–8.

Heat sink clip 250 is provided to secure the finned heat sink 224 to the gate array 212. The heat sink clip 250 is constructed of resilient, preferably metallic, material and includes body 252 terminating at both ends in downwardly depending flanges 254. Each flange 254 includes an opening 256 and an outwardly flaring lip 258. Aperture 262 is defined in the body 252 of the heat sink clip having a diameter greater than the outer diameter of the post of the finned heat sink 224. Four tabs 264 extend upwardly from the body of the heat sink clip opposite the flanges and each of the tabs includes an inwardly projecting tang 266.

In assembled condition the gate array 212 is positioned in the cavity 234 of the frame 232 with the leads of the gate array extending downwardly for presentation to aligned preformed holes (not shown) in a printed circuit board (not shown). The heat sink clip 250 is pressed down onto frame 232 with the flanges 254 aligned with one of the latching members 240. The flanges 254 are each brought into engagement with one of the latching members. Specifically, the lips 258 of the flanges encounter the inclined surface 244 of the latching member and to deflect the flanges outwardly. The flanges then assume a relaxed position with the teeth caught in the openings and securing the heat sink to the frame with the finned heat sink in contact with the gate array. The finned heat sink is then brought down into contact with the pad 218 of the gate array housing and the fins 228 of the heat sink encounter the tabs 264 of the heat sink clip. The tabs are deflected outwardly as the heat sink is lowered onto the gate array.

When the heat sink is mounted on the pad of the gate array, the tabs 264 spring inwardly and return to a relaxed position with the respective tangs 266 in contact with the upper side of one of the fins. The finned heat sink is thus automatically aligned and secured against lateral or upward movement with respect to the gate array. The heat sink clip 250 simultaneously exerts a resilient downward force on the finned heat sink urging it into intimate thermal contact with the pad. The heat sink clip assembly may be quickly and easily disassembled by disengaging the ends of the heat sink clip from the latching members of the frame and withdrawing the finned heat sink from the gate array. Alternatively, the finned heat sink 224 may be preassembled to the heat sink clip 250 by engagement with the tabs 264 as herein described and the sub-assembly then mounted on the frame with the post of the finned heat sink in contact with the pad 218 of the gate array 212 by engaging the flanges of the heat sink clip with the latching members 240 of the frame.

Although the invention has been disclosed above with regard to particular and preferred embodiments, these are advanced for illustrative purposes only and are not intended to limit the scope of this invention. For instance, although the heat sink clip assembly has been illustrated in use with a finned heat sink and gate array, the invention is applicable for use with other heat sink designs as well as other types of electronic device packages. It is to be understood, therefore, that various changes and modifications may be resorted to without departing from the spirit and scope of the invention as defined by the appended claims.

What is claimed is:

1. Apparatus for mounting a heat sink having a plurality of spaced fins extending radially from a central post on an enclosed and sealed electronic device package having a plurality of leads extending substantially parallel from one surface thereof comprising:

(a) electrically insulating frame means having an open cavity adapted to receive and support an electronic device package about the periphery thereof with the leads extending from [the] *said* device package through said open cavity and a pair of spaced latching means extending from opposite sides of said frame means; and (b) elongated clip means adapted to releasably grip a heat sink and urge it into thermal contact with the face of said device package opposite said leads, each end of said elongated clip means adapted to mate with one of said pair of latching means.

2. Apparatus as defined in claim 1 wherein said clip means comprises a body extending across said open cavity and includes a downwardly depending flange at each end thereof adapted to mate with one of said pair of latching means.

3. Apparatus as defined in claim 2 wherein said body of said clip means includes an arcuate section adapted to partially surround the post of the heat sink between two of the radially extending fins.

4. Apparatus as defined in claim 1 wherein said clip means includes at least two upwardly extending arms adapted to grip the heat sink about the lateral periphery thereof.

5. Apparatus as defined in claim 4 wherein said upwardly extending arms each include an inwardly extending barb adapted to engage one of the radially extending fins of the heat sink.

6. The combination comprising:

(a) a heat sink having a plurality of spaced fins extending radially from a central post;

(b) an enclosed and sealed electronic device package having first and second oppositely disposed external major faces and a plurality of leads extending substantially parallel from said second major face;

(c) electrically insulating frame means having a pair of spaced latching means extending from opposite sides thereof and having an open cavity receiving and supporting said device package therein with said leads projecting through said open cavity; and (d) elongated clip means urging said heat sink into thermal contact with said first major face of said [electronic] device package with each end of said clip means releasably attached to one of said latching means.

7. The combination set forth in claim 6 wherein said clip means comprises a body extending across said open cavity and includes a downwardly depending flange at each end thereof mating with one of said latching means.

8. The combination set forth in claim 7 wherein said body of said clip means includes an arcuate section partially surrounding said post of said heat sink between two of said fins.

9. The combination set forth in claim 6 wherein said clip means is positioned between said frame means and said heat sink and includes at least two upwardly extending arms grippingly engaging said heat sink.

10. The combination set forth in claim 9 wherein each of said upwardly extending arms includes an inwardly extending barb engaging one of the radially extending fins of said heat sink.

11. Apparatus for mounting a heat sink having a plurality of spaced fins extending radially from a central post on an electronic device package having a plurality of leads extending substantially parallel from one surface thereof comprising:

(a) electrically insulating frame means having an open cavity adapted to receive and support an electronic device package about the periphery thereof with the leads extending from [the] *said* device package through said open cavity and a pair of spaced latching means extending from opposite sides of said frame means; and (b) elongated clip means including at least two upwardly extending arms adapted to releasably grip a heat sink about the lateral periphery thereof and urge it into thermal contact with the face of said device package opposite said leads, each end of said elongated clip means adapted to mate with one of said pair of latching means.

12. Apparatus as defined in claim 11 wherein said upwardly extending arms each include an inwardly extending barb adapted to engage one of the radially extending fins of the heat sink.

13. The combination comprising:

(a) a heat sink having a plurality of spaced fins extending radially from a central post;

(b) an electronic device package having first and second oppositely disposed major faces and a plurality of leads extending substantially parallel from said second major face;

(c) electrically insulating frame means having a pair of spaced latching means extending from opposite sides thereof and having an open cavity receiving and supporting said device package therein with said leads projecting through said open cavity; and (d) elongated clip means positioned between said frame means and said heat sink including at least two upwardly extending arms grippingly engaging said heat sink and urging said heat sink into thermal contact with said first major face of said electronic device package with each end of said clip means releasably attached to one of said latching means.

14. The combination set forth in claim 13 wherein each of said upwardly extending arms includes an inwardly extending barb engaging one of the radially extending fins of said heat sink.

*15. Apparatus for mounting a heat sink on an enclosed and sealed electronic device package having a plurality of leads extending substantially parallel from one surface thereof comprising:*

*(a) electrically insulating frame means having an open cavity adapted to receive and support an electronic device package about the periphery thereof with the leads extending from the device package through said open cavity and a pair of spaced latching means extending from opposite sides of said frame means; and*

*(b) elongated clip means adapted to releasably grip a heat sink and urge it into thermal contact with the face of said device package opposite said leads, each end of*

*said elongated clip means adapted to mate with one of said pair of latching means.*

*16. Apparatus as defined in claim 15 wherein said clip means comprises a body extending across said open cavity and includes a downwardly depending flange at each end thereof adapted to mate with one of said pair of latching means.*

*17. The combination comprising:*

*(a) a heat sink;*

*(b) an enclosed and sealed electronic device package having first and second oppositely disposed external major faces and a plurality of leads extending substantially parallel from said major face;*

*(c) electrically insulating frame means having a pair of spaced latching means extending from opposite sides thereof and having an open cavity receiving and supporting said device package therein with said leads projecting through said open cavity; and*

*(d) elongated clip means urging said heat sink into thermal contact with said first major face of said device package with each end of said clip means releasably attached to one of said latching means.*

*18. The combination set forth in claim 17 wherein said clip means comprises a body extending across said open cavity and includes a downwardly depending flange at each end thereof mating with one of said latching means.*

* * * * *